(12) United States Patent
Yuan et al.

(10) Patent No.: US 6,905,939 B2
(45) Date of Patent: Jun. 14, 2005

(54) PROCESS FOR FORMING SILICON OXIDE MATERIAL

(75) Inventors: Zheng Yuan, Fremont, CA (US); Xinyun Xia, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 296 days.

(21) Appl. No.: 10/090,103

(22) Filed: Feb. 27, 2002

(65) Prior Publication Data

US 2003/0161951 A1 Aug. 28, 2003

(51) Int. Cl.[7] .................. H01L 21/76; H01L 21/311; H01L 21/31
(52) U.S. Cl. .................. 438/424; 438/438; 438/702; 438/763
(58) Field of Search .................. 438/424, 435, 438/437, 702, 763, 789; 118/724, 715, 725

(56) References Cited

U.S. PATENT DOCUMENTS 5,928,428 A * 7/1999 Horie .................. 118/724
6,180,490 B1 * 1/2001 Vassiliev et al. .......... 438/424
6,248,397 B1   6/2001 Ye

OTHER PUBLICATIONS

Werner Gasser et al., Quasi–monolayer deposition of silicon dioxide. Thin Solid Films, 1994, pp. 213–218, 250.
George, S.M., et al., Atomic layer controlled deposition of $SiO_2$ and $Al_2O_3$ using ABAB . . . binary reaction sequence chemistry, Applied Surface Science, 1994, pp. 460–467, 82/83.
Klaus, J.W., et al., Atomic layer deposition of $SiO_2$ at room temperature using $NH_3$–catalyzed sequential surface reactions, Surface Science, 2000, pp. 61–90, 447.
Klaus, J.W., et al., Atomic layer controlled growth of $SiO_2$ films using binary reaction sequence chemistry, Appl. Phys. Lett., 1997, pp. 1092–1094, 70(9).
Klaus, J.W., et al., Atomic layer deposition of $SiO_2$ using catalyzed and uncatalyzed self–limiting surface reactions, Surface Review and Letters, 1999, pp. 435–448, vol. 6, Nos. 3&4.
Klaus, J.W., et al., Growth of $SiO_2$ at room temperature with the use of catalyzed sequential Half–Reactions, Science, 1997, pp. 1934–1936, vol. 278.
Morishita, et al., Atomic–layer Chemical–Vapor–Deposition of $SiO_2$ by Cyclic Exposures of $CH_3OSI(NCO)_3$ and $H_2O_2$, Jpn. J. Appl. Phys., 1995, pp. 5738–5742, vol. 34.
Sneh, et al., Atomic layer growth of $SiO_2$ on Si(100) using $SiCl_4$ and $H_2O$ in a binary reaction sequence, Surface Science, 1995, pp. 135–152, 334.

* cited by examiner

Primary Examiner—Michael S. Lebentritt
Assistant Examiner—Ron Pompey
(74) Attorney, Agent, or Firm—Townsend and Townsend and Crew

(57) ABSTRACT

A thin layer of silicon oxide is formed by cyclic introduction of a silicon-containing precursor gas and an oxidizing gas separated by an intervening purge step. The resulting thin oxide layer enables subsequent conventional CVD of oxide to produce a more uniform deposited oxide layer over nonhomogenous surfaces, for example the silicon nitride mask/thermal oxide liner surfaces created during fabrication of shallow trench isolation structures.

5 Claims, 3 Drawing Sheets

PROCESS FOR FORMING SILICON OXIDE MATERIAL

BACKGROUND OF THE INVENTION

Silicon oxide is a dielectric material that is widely employed in the fabrication of semiconductor devices. Silicon oxide may be formed in a number of ways. In one approach, silicon oxide may be thermally grown from an underlying silicon material through exposure to oxidizing agents.

Alternatively, silicon oxide may be formed through the process of chemical vapor deposition (CVD). One example of such a CVD reaction involves the reaction of ozone ($O_3$) and tetraethylorthosilane $Si(OCH_2CH_3)_4$ (TEOS) gases at elevated temperatures, resulting in the deposition of silicon oxide as a solid material. In a typical conventional TEOS $O_3$—$O_2$ CVD process for forming silicon oxide, silicon-containing precursor materials and oxidant are flowed into the deposition chamber simultaneous with the application of heat. As a result of these conditions, silicon oxide layers are rapidly formed.

One particularly important use for silicon oxide is in the formation of shallow trench isolation (STI) structures between active devices of an integrated circuit. FIG. 1A shows a cross-sectional view of the typical starting point for formation of an STI structure. Mask 102 comprising silicon nitride layer 104 overlying pad oxide layer 105 is patterned over silicon substrate 106. Silicon in unmasked regions 108 is removed to form trenches 110. Silicon sidewalls 112 of trenches 110 are then exposed to an oxidizing ambient to form thermal oxide trench liner 114.

As shown in FIG. 1B, conventionally the shallow trench isolation structure is formed by depositing silicon oxide over the entire surface, including over mask 102 and within trench 110. However, the thermally grown oxide 114 provides a relatively inactive surface that results in lower rates of oxide deposition within trench 110. The higher rate of deposition of oxide over silicon nitride layer 104 of the mask 102 may cause greater accumulation of oxide material outside of trench 110, resulting in the possible formation of voids 116 within trench 110. Voids 116 can degrade the dielectric properties of the STI structure that is ultimately formed.

Accordingly, new and improved processes for forming uniform, high quality layers of silicon oxide are valuable.

SUMMARY OF THE INVENTION

Embodiments in accordance with the present invention provide a thin layer of silicon oxide formed by repeated cyclic introduction of silicon-containing and oxidizing reactant gases to a deposition chamber. The resulting thin oxide layer enables subsequent conventional oxide CVD to create a more uniformly deposited oxide layer over nonhomogenous surfaces, for example the silicon nitride mask/thermal oxide liner surfaces created during STI formation.

An embodiment of a method of forming a thin silicon oxide layer over a substrate disposed in a substrate processing chamber comprises introducing tetraethylorthosilane into the processing chamber. The tetraethylorthosilane is purged from the processing chamber, and then ozone is introduced into the processing chamber after purging of the tetraethylorthosilane. The ozone is then purged from the processing chamber. This cycle of steps may be repeated to create additional silicon oxide material.

An embodiment of a method for treating a surface to receive chemical vapor deposited silicon oxide in accordance with the present invention comprises exposing the surface to a silicon-containing precursor gas in a processing chamber, and purging the silicon-containing precursor gas from the processing chamber. An oxidant is introduced into the processing chamber after purging the silicon-containing precursor gas. The oxidant is purged from the processing chamber, such that a thin layer of oxide is formed over the surface to serve as a basis for subsequent uniform chemical vapor deposition of silicon oxide.

An embodiment of a method of forming a shallow trench isolation structure on a silicon substrate having a plurality of trenches etched therein to define isolation regions and a plurality of masked regions on an upper surface of said substrate positioned between said isolation regions, said method comprising exposing the substrate to an oxidizing ambient to create a thermal oxide layer within the trench. A layer of silicon oxide is formed over the thermal oxide layer by alternating (i) introducing to the chamber a first gas consisting of one of a silicon-containing precursor gas and an oxidant, (ii) purging the first gas from the chamber, (iii) introducing to the chamber a second gas consisting of the other of the silicon-containing precursor gas and the oxidant, and (iv) purging the second gas from the chamber. Steps (i)–(iv) are repeated until a desired thickness of the silicon oxide layer is achieved; and then the trenches are filled with chemical vapor deposited silicon oxide material.

These and other embodiments of the present invention, as well as its features and some potential advantages are described in more detail in conjunction with the text below and attached figures.

DESCRIPTION OF THE SPECIFIC EMBODIMENTS

A thin layer of silicon oxide is formed by repeated cyclic introduction of silicon-containing and oxidizing reactant gases to a deposition chamber separated by an intervening purge step. The resulting thin oxide layer enables subsequent conventional oxide CVD performed in the same chamber to create a uniform deposited oxide layer over nonhomogenous surfaces, for example the silicon nitride mask/thermal oxide liner surfaces present during STI formation.

Control over the formation of thin oxide layers in accordance with embodiments of the present invention is accomplished by repeated cyclic introduction of silicon-containing and oxidizing precursor gases separated by a purge step. In an embodiment of a method for forming silicon oxide in accordance with the present invention, introduction of a TEOS/carrier gas is followed by a first purge. Next, an oxidant in the form of an oxygen/ozone mixture is introduced into the chamber and then removed by a second purge step to form a very thin layer of silicon oxide. Repetition of this cycle of steps affords precise control over the thickness and quality of the oxide layer ultimately formed.

One chemical system that is useful for formation of thin oxide layers in accordance with an embodiment of the present invention utilizes tetraethylorthosilane (TEOS) as the silicon-containing precursor material and ozone as the oxidant.

(A) $SiOH^* + Si(OCH_2CH_3)_4 \rightarrow SiOSi(OEt)_3^* + EtOH$ (@<10 torr, <0.5–2 sec)

(B) purge TEOS (C) $SiOEt^* + O_3 \rightarrow SiOH^* + SiOSi^* + CO + H_2O$ (@<10 torr, <0.5–2 sec)

(D) purge ozone

Figure 2:
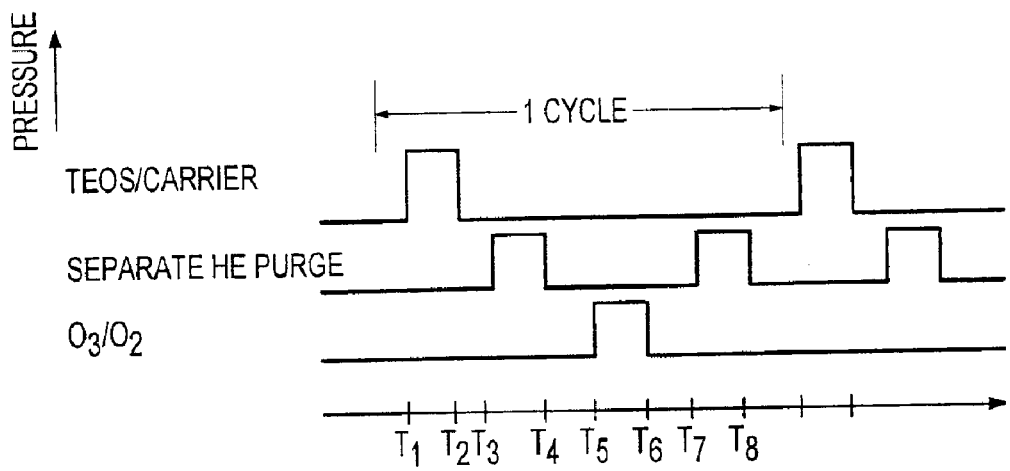
FIG. 2 shows a timing diagram of one embodiment of a silicon oxide deposition process in accordance with the present invention.

FIG. 2 shows a timing diagram of one embodiment of a silicon oxide deposition process in accordance with the present invention. At first time $T_1$, a mixture of TEOS and a carrier gas are introduced into the chamber. At a second time $T_2$ about 0.5–2 seconds after $T_1$, the TEOS/carrier gas flow is halted.

At a third time $T_3$, an inert gas (such as He, Ar, $N_2$, or combinations thereof) is introduced to the chamber to purge any remaining TEOS/carrier gas. At a fourth time $T_4$, the flow of the purge gas is halted.

At a fifth time $T_5$, ozone is introduced into the chamber. At a sixth time $T_6$ about 0.5–2 seconds after $T_5$, the flow of ozone into the chamber is halted.

At a seventh time $T_7$, an inert gas is introduced to the chamber to purge any remaining ozone. At an eighth time $T_8$, the flow of the purge gas is again halted, setting the stage for another TEOS/purge/ozone cycle to deposit oxide.

Figure 3A:
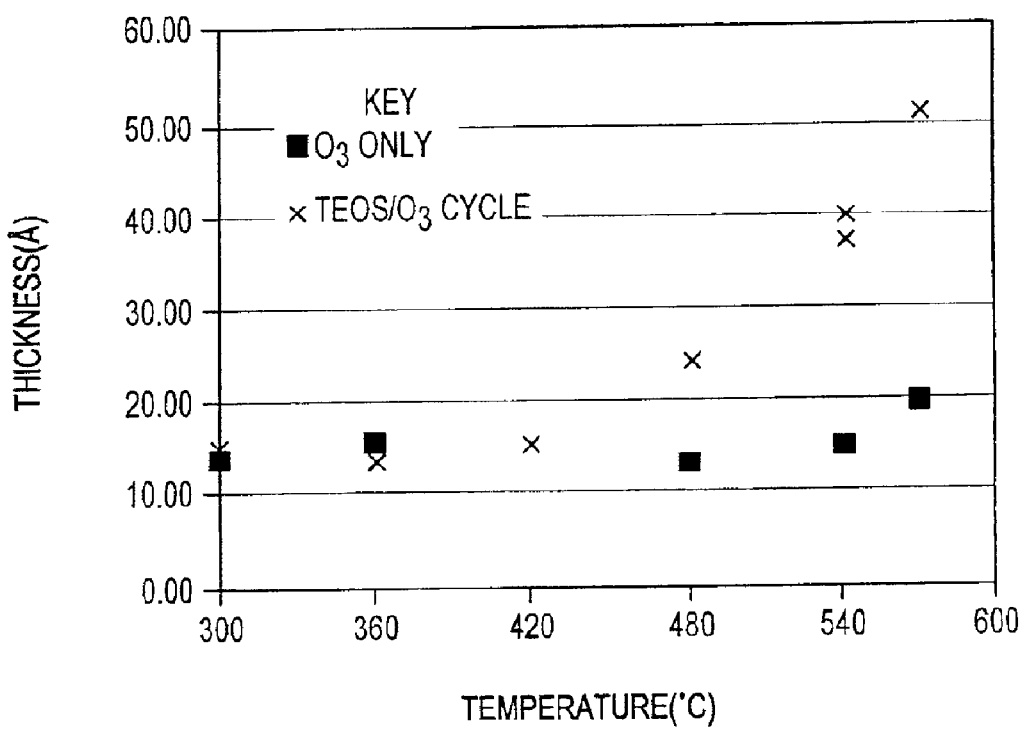
FIG. 3A plots deposited film thickness versus silicon substrate temperature for silicon oxide deposition processes utilizing TEOS/$O_3$ and $O_3$ only.

FIG. 3A plots deposited film thickness versus substrate temperature for cyclic silicon oxide deposition processes utilizing TEOS/$O_3$ and $O_3$ only. FIG. 3A shows that for the TEOS/$O_3$ reaction conditions, above oxide formation occurs above 420° C. and the rate of deposition increases with increasing substrate temperature. FIG. 3A also shows that oxide formation in accordance with embodiments of the present invention is distinct from the oxide formation attributable to thermal oxidation of the silicon surface occurring above 540° C.

Figure 3B:
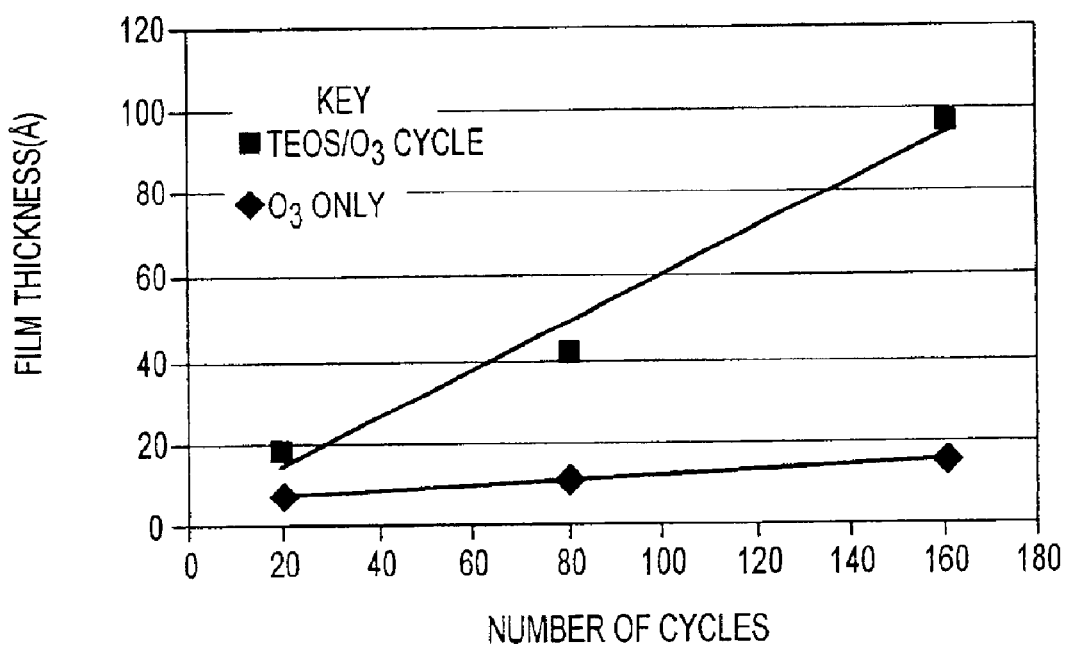
FIG. 3B plots deposited film thickness versus number of gas exposure cycles for silicon oxide deposition processes utilizing TEOS/$O_3$ and $O_3$ only.

FIG. 3B plots deposited film thickness versus number of gas exposure cycles for silicon oxide deposition processes utilizing TEOS/$O_3$ and $O_3$ only. For the TEOS/$O_3$ deposition conditions, FIG. 3B shows a linear correlation between the number of cycles and the thickness of film growth. By contrast, little or no film growth occurs in the pure $O_3$ ambient even after over a hundred cycles have taken place.

The TEOS/$O_3$ oxide deposition conditions just described likely do not result in formation of silicon oxide one monolayer at a time. Specifically, TABLE A presents surface roughness data revealed by atomic force microscopy (AFM) of a silicon oxide layer formed on the center and edge of a wafer utilizing one embodiment of the present invention.

TABLE A

| SAMPLE | WAFER LOCATION | ROUGHNESS (nm) | | |
|---|---|---|---|---|
| | | RMS | $R_a$ | $R_{max}$ |
| Bare Si | center | 0.18 | 0.14 | 2.39 |
| conv. CVD | center | 0.26 | 0.21 | 2.31 |
| TEOS + $O_3$ After 20 cycles | center | 0.17 | 0.13 | 2.37 |
| TEOS + $O_3$ After 80 cycles | center | 0.24 | 0.18 | 3.27 |
| TEOS + $O_3$ After 160 cycles | center | 0.59 | 0.47 | 5.35 |
| $O_3$ only After 20 cycles | center | 0.18 | 0.14 | 2.83 |
| $O_3$ only After 80 cycles | center | 0.20 | 0.14 | 3.30 |
| $O_3$ only After 160 cycles | center | 0.18 | 0.14 | 2.47 |
| Bare Si | edge | 0.19 | 0.15 | 3.23 |
| conv. CVD | edge | 0.25 | 0.20 | 2.03 |
| TEOS + $O_3$ After 20 cycles | edge | 0.17 | 0.13 | 4.76 |
| TEOS + $O_3$ After 80 cycles | edge | 0.31 | 0.23 | 4.44 |
| TEOS + $O_3$ After 160 cycles | edge | 0.72 | 0.57 | 6.67 |
| $O_3$ only After 20 cycles | edge | 0.18 | 0.14 | 2.44 |
| $O_3$ only After 80 cycles | edge | 0.18 | 0.14 | 1.72 |
| $O_3$ only After 160 cycles | edge | 0.21 | 0.17 | 3.46 |

The AFM data of TABLE A shows that as the oxide film grows from 20 to 100 Å (20 cycles to 160 cycles), the average roughness ($R_a$) of the silicon oxide film increases from about 0.13 to about 0.47 nm, a surface roughness comparable with that resulting from formation by conventional CVD processes. This increased surface roughness tends to indicate that cyclic silicon oxide deposition in accordance with embodiments of the present invention does not occur precisely one atomic layer at a time.

Embodiments of processes for depositing a layer of silicon oxide material in accordance with the present invention have many potential applications. One application is in the formation of STI structures, as illustrated below in FIGS. 4A–4C.

Figure 4A:
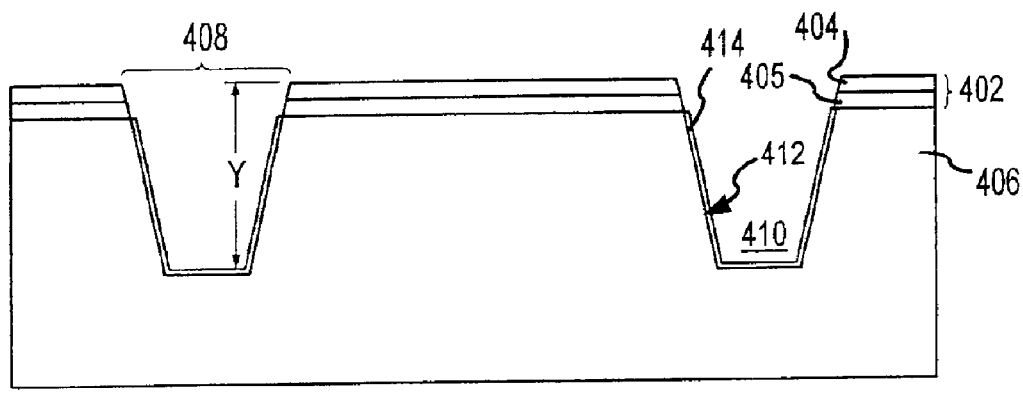
FIGS. 4A–4C show simplified cross-sectional views of the formation of oxide-filled trenches utilizing a process in accordance with an embodiment of the present invention.

FIG. 4A shows a cross-sectional view of the typical starting point of formation of an STI structure. Mask 402 comprising silicon nitride layer 404 overlying pad oxide layer 405 is patterned over silicon substrate 406. Silicon in unmasked regions 408 is removed to form trenches 410 having a depth Y that may typically be between about 0.3–0.4 μm. Sidewalls 412 of trenches 410 are then exposed to an oxidizing ambient to form thermal oxide trench liner 414.

Figure 1A:
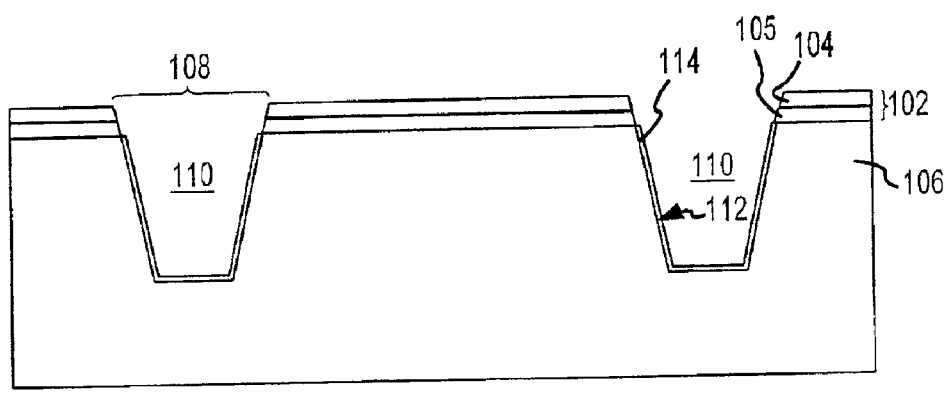
FIGS. 1A–1B show simplified cross-sectional views of the formation of oxide-filled trenches utilizing a conventional CVD process.
Figure 1B:
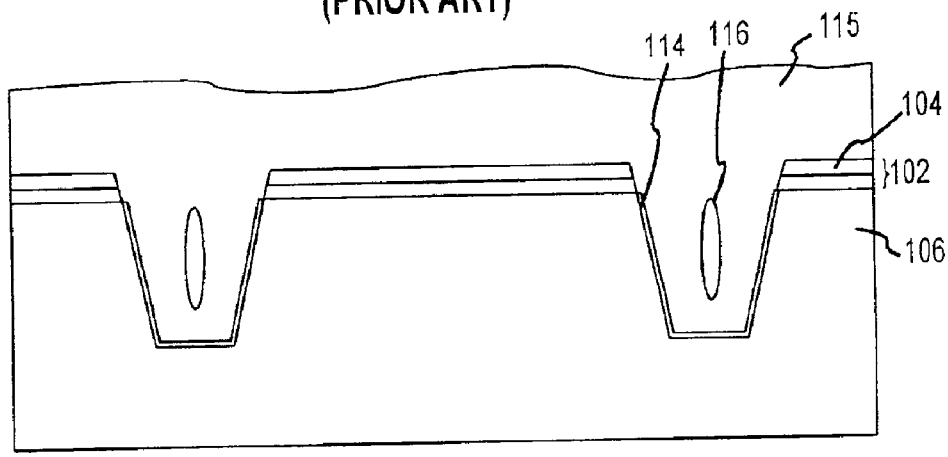

As previously shown and described in conjunction with FIG. 1B, in conventional processes the shallow trench isolation structure is formed by depositing silicon oxide over this entire nonhomogenous surface, including over mask 402 and within trench 410. However, the thermally grown oxide liner layer is relatively inactive, and hence the rate of deposition of oxide over silicon nitride layer of the mask may cause greater accumulation of material outside of the trench, resulting in the possible formation of gaps within the trench.

Figure 4B:
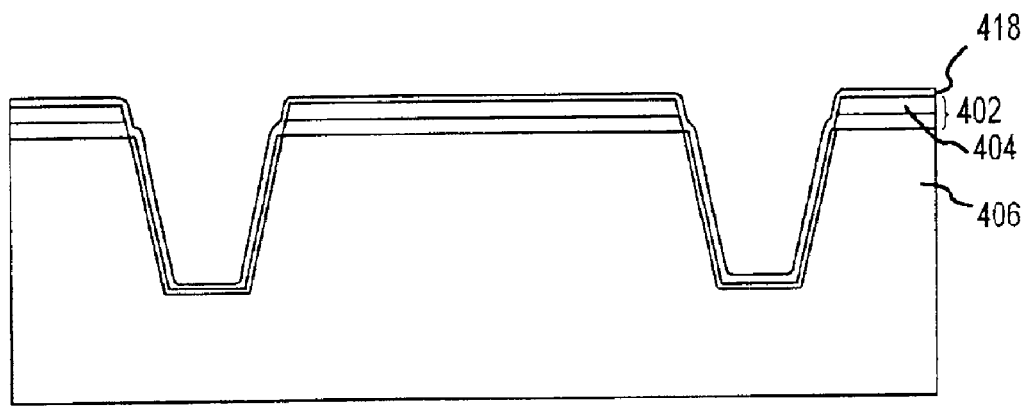

Accordingly, a thin layer of oxide may first be formed over the entire surface to provide a basis for subsequent uniform CVD of oxide. As shown in FIG. 4B, oxide layer 418 is formed in accordance with embodiments of the present invention through cyclic introduction of silicon-containing and oxidizing gases separated by purge steps. The thickness of layer 418 formed in FIG. 4B can be precisely controlled so that there is no risk of the formation of gaps within the trenches. The thickness of layer 418 may range from about 10–100 Å, and is most preferably between about 20–30 Å.

Figure 4C:
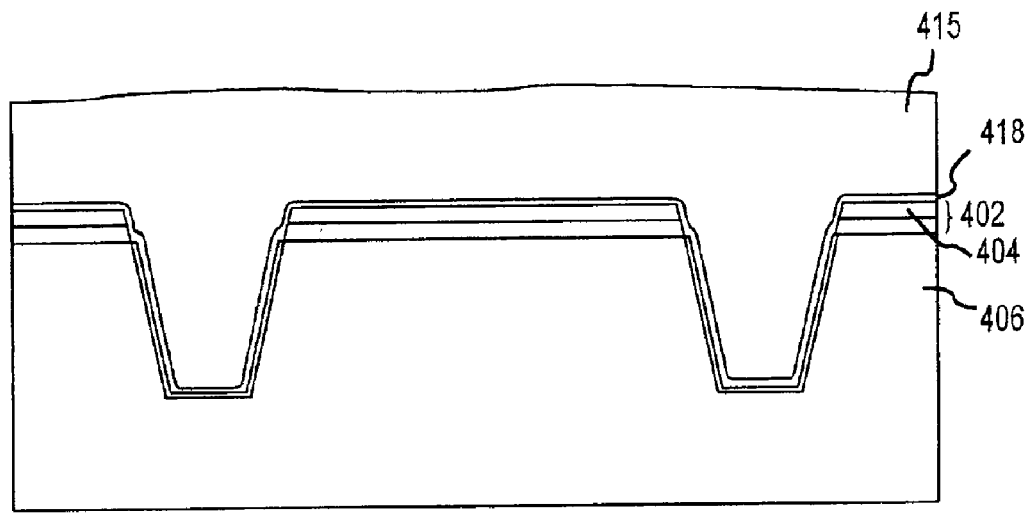

As shown in FIG. 4C, thin oxide layer 418 provides a uniform oxide surface to serve as a template for subsequent rapid formation of oxide 415 by conventional CVD. Examples of conventional CVD silicon oxide formation processes include but are not limited to the mixing of oxidants and silicon-containing precursor gases at elevated temperatures, reduced pressures, or in the presence of plasma. Examples of oxidants include but are not limited to oxygen, ozone, steam, and hydrogen peroxide. Examples of silicon-containing precursor gases include but are not limited to TEOS, silane, $SiCl_4$, $Si(NCO)_4$, and $CH_3OSi(NCO)_3$.

As a result of the presence of the thin oxide starting surface 418, rates of oxide formation by conventional CVD techniques are similar both inside and outside of trench 410, and thus little or no gap is created.

The above description is illustrative and not restrictive, and as such the process parameters and applications listed above should not be limiting to the claims as described herein. For example, while the invention is illustrated above with reference to one particular embodiment, one of ordinary skill in the art would recognize that the present invention is not limited to this particular example.

Thus while the above discussion has described a cyclic thin oxide formation process in which the silicon-containing precursor gas is introduced first, embodiments of the present invention are not limited to such an example. In accordance with alternative embodiments of the present invention, the surface upon which the thin oxide is sought to be formed may be exposed to the oxidizing gas as a first step prior to introduction of the silicon-containing precursor gas.

Moreover, the present invention has been described so far in connection with formation of the thin oxide layer followed by performance of the conventional CVD process in the same chamber utilizing the same reactants, thereby obviating the need for a wafer transfer step and increasing throughput. However, formation of the thin oxide layer in the same chamber utilizing the same reactants as the subsequent conventional CVD step is not required by the present invention. In accordance with alternative embodiments of the present invention, a cyclic thin oxide formation process and a subsequent CVD process utilizing the same or different reactants could be performed in different processing chambers.

In addition, while the invention has been described so far in connection with formation of the thin silicon oxide layer through the use of ozone and TEOS, the invention is not limited to this particular embodiment. Other reactants could be employed to create a thin, uniform oxide layer as a starting point for a subsequent, more rapid and uniform conventional CVD deposition step, and the resulting method or apparatus would fall within the scope of the present invention.

For example, a two-stage oxide formation process involving different reaction systems could be utilized to create a thin oxide layer prior to conventional oxide CVD in accordance with the present invention. One alternative reaction system may employ steam as the oxidant and $SiCl_4$ as the silicon-containing precursor. Another alternative reaction system may employ steam as the oxidant and $Si(NCO)_4$ as the silicon-containing precursor. Still another example of an alternative reaction system may employ hydrogen peroxide as the oxidant and $CH_3OSi(NCO)_3$ as the silicon-containing precursor.

As with the $TEOS/O_3$ reactant system described above, a thin silicon oxide layer produced by cycling the two stages of these reaction systems would enhance uniformity of oxide that is subsequently formed by conventional CVD processes.

Given the above detailed description of the present invention and the variety of embodiments described therein, these equivalents and alternatives along with the understood obvious changes and modifications are intended to be included within the scope of the present invention.

What is claimed is:

1. A method of forming a shallow trench isolation structure on a silicon substrate having a plurality of trenches etched therein to define isolation regions and a plurality of masked regions on an upper surface of said substrate positioned between said isolation regions, said method comprising:

exposing the substrate to an oxidizing ambient to create a thermal oxide layer within the trench;

forming a layer of silicon oxide over the thermal oxide layer by alternating (i) introducing to the chamber a first gas consisting of one of a silicon-containing precursor gas and an oxidant, (ii) purging the first gas from the chamber, (iii) introducing to the chamber a second gas consisting of the other of the silicon-containing precursor gas and the oxidant, (iv) purging the second gas from the chamber, and (v) repeating steps (i)–(iv) until a desired thickness of the silicon oxide layer is achieved; and filling the trenches with chemical vapor deposited silicon oxide material.

2. The method of claim 1 wherein the silicon-containing precursor gas comprises tetraethylorthosilane (TEOS) and the oxidant comprises ozone.

3. The method of claim 1 wherein the silicon-containing precursor gas comprises $SiCl_4$ and the oxidant comprises steam ($H_2O$).

4. The method of claim 1 wherein the silicon-containing precursor gas comprises $Si(NCO)_4$ and the oxidant comprises steam ($H_2O$).

5. The method of claim 1 wherein the silicon-containing precursor gas comprises $CH_3OSi(NCO)_4$ and the oxidant comprises hydrogen peroxide ($H_2O_2$).

* * * * *